United States Patent
Nakano et al.

(10) Patent No.: US 7,667,943 B2
(45) Date of Patent: Feb. 23, 2010

(54) ELECTROSTATIC CHUCK

(75) Inventors: Akio Nakano, Annaka (JP); Ryuichi Handa, Annaka (JP); Ikuo Sakurai, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/790,635

(22) Filed: Apr. 26, 2007

(65) Prior Publication Data

US 2007/0253139 A1    Nov. 1, 2007

(30) Foreign Application Priority Data

Apr. 28, 2006    (JP)    ............... 2006-124971

(51) Int. Cl.
 *H01L 21/683*    (2006.01)
(52) U.S. Cl. ...................................... 361/234
(58) Field of Classification Search .................. 361/234
 See application file for complete search history.

(56) References Cited

U.S. PATENT DOCUMENTS

| | | | | |
|---|---|---|---|---|
| 5,023,288 A | * | 6/1991 | Hirai et al. | ................. 524/268 |
| 5,335,457 A | | 8/1994 | Matsuda et al. | |
| 5,528,451 A | * | 6/1996 | Su | ............................. 361/234 |
| 6,071,630 A | * | 6/2000 | Tomaru et al. | ............. 428/627 |
| 6,563,195 B1 | * | 5/2003 | Tomaru et al. | ............. 257/620 |

FOREIGN PATENT DOCUMENTS

| | | |
|---|---|---|
| JP | 59-64245 A | 4/1984 |
| JP | 2-27748 A | 1/1990 |
| JP | 6-61202 A | 3/1994 |
| JP | 10-335439 A | 12/1998 |
| JP | 11-233604 A | 8/1999 |
| JP | 2004-31938 A | 1/2004 |
| JP | 2004-253718 A | 9/2004 |

* cited by examiner

*Primary Examiner*—Stephen W Jackson
*Assistant Examiner*—Ann T Hoang
(74) *Attorney, Agent, or Firm*—Birch, Stewart, Kolasch & Birch, LLP

(57) ABSTRACT

An electrostatic chuck comprises an insulating layer with an electrode embedded therein and having a surface to come in contact with a workpiece to be held. Formed on the insulating layer surface is a silicone rubber layer which is filled with reinforcing silica, but free of another filler having an average particle size of at least 0.5 μm. The ESC allows for an intimate contact with a wafer and has an improved cooling capacity.

4 Claims, 1 Drawing Sheet

ELECTROSTATIC CHUCK

CROSS-REFERENCE TO RELATED APPLICATION

This non-provisional application claims priority under 35 U.S.C. §119(a) on Patent Application No. 2006-124971 filed in Japan on Apr. 28, 2006, the entire contents of which are hereby incorporated by reference.

TECHNICAL FIELD

This invention relates to an electrostatic chuck (ESC) useful in the manufacture of semiconductor integrated circuits, specifically in steps where wafers must be held in place, especially ion implantation, sputtering and plasma etching steps.

BACKGROUND ART

In the process of manufacturing semiconductor integrated circuits, wafers are usually held in place by wafer chucks of the electrostatic attraction or Johnsen-Rahbek effect type, that is, so-called electrostatic chucks. The electrostatic chuck includes an insulating layer, and organic resins such as polyimides, ceramics such as alumina and aluminum nitride, and rubber elastomers such as silicone rubber have been used as the insulating layer.

In the plasma etching step, it is essential to inhibit a wafer from being heated by the plasma and maintain a uniform and constant temperature distribution over the wafer. To this end, the electrostatic chuck is provided on the back side with a cooling mechanism such as a chiller. Given a uniform and constant temperature distribution, a high selectivity is established between the masking material and the underlying substrate to be etched and an anisotropic feature is readily etchable. These features ensure high accuracy etching.

The electrostatic chuck using a ceramic insulating layer is fully durable against a plasma gas and highly heat conductive. The ceramic insulating layer, however, is so hard that its contact with a wafer is not fully intimate because the wafer has an irregular surface. This results in an increased thermal contact resistance and an insufficient cooling capacity. To promote heat transfer, a gas cooling system wherein an inert gas such as helium flows between the wafer and the insulating layer is employed. This system, however, requires a fine working step of forming inert gas flow channels in the insulating layer surface and a feed source of the inert gas, and is disadvantageous in that the ESC structure becomes complex and the ESC manufacture cost is increased. Physical contact and rub between the ceramic insulating layer and a wafer generate microscopic particles which deposit on the back side of the wafer so that they are carried over to the subsequent process, causing the problem of defects in the wafer microprocessing.

The electrostatic chuck using a polyimide insulating layer is easy to manufacture and inexpensive, but less durable against a plasma gas. Undesirably it has a low heat conductivity and a high hardness which leads to an increased thermal contact resistance and an insufficient cooling capacity. Like the ceramic insulator, it also suffers from the problem of particle generation.

JP-A 59-64245 discloses an electrostatic chuck comprising a metal plate, a first insulating film on the metal plate comprising a heat dissipating silicone prepreg obtained by impregnating glass cloth with silicone rubber, a copper pattern formed on the first insulating film as an electrode, and a second insulating film of silicone rubber on the copper pattern. Since the silicone rubber or elastomer is used in the insulating layer, this ESC has a relatively low thermal contact resistance and a good cooling capacity. The use of this ESC is effective in maintaining the wafer temperature uniform. Since the silicone rubber is soft, few particles are generated by contact with the wafer. The number of particles generated is reduced as compared with the ceramic and polyimide layers. However, a heat conductive filler such as alumina, zinc oxide or boron nitride which has been added to the silicone rubber for imparting heat conductivity thereto will escape and fall out, becoming particles. While an ESC having minimal particle generation is needed to meet the current demand of reducing wafer processing line width toward higher integration, this ESC is regarded short in performance.

JP-A 2-27748 discloses an electrostatic chuck comprising a first insulating layer of polyimide film, an electrode layer of copper foil, and a second insulating layer of polyimide film laminated on a metal substrate in sequence using an adhesive, a workpiece to be held being rested on the second insulating layer, wherein a contact improving layer is formed on the second insulating layer for improving the thermal contact with the workpiece. This ESC, however, has the risk that the contact improving layer itself can be transferred to the wafer or the heat conductive filler in the contact improving layer can fall out, causing particle generation.

JP-A 10-335439 discloses an electrostatic chuck comprising a metal substrate, a first insulating layer of silicone rubber thereon, an electroconductive pattern on the first insulating layer, and a second insulating layer of silicone rubber on the conductive pattern having an embossed surface, wherein the amount of particles depositing on a wafer is reduced. This ESC, however, has the risk of particle generation because the heat conductive filler in the silicone rubber can fall out.

JP-A 11-233604 discloses an electrostatic chuck having a suction surface on which a protective film of silicone resin, epoxy resin or acrylic resin is formed, the chuck having improved resistance to abrasion and damage. Where this protective film is hard, the wafer cooling capacity becomes low and rubs with a wafer can generate particles. The filler other than silica in the protective film can fall out, causing particle generation.

JP-A 2004-253718 discloses an electrostatic chuck comprising a ceramic substrate and an electrode embedded therein, the chuck having a suction surface on which a tacky/anti-slip layer of silicone resin, polyimide resin or the like is formed. This ESC allows for easy alignment of a workpiece to be suction held and causes no damages to the workpiece. Likewise, this ESC has the risk of particle generation from the tacky/anti-slip layer.

DISCLOSURE OF THE INVENTION

An object of the invention is to provide an electrostatic chuck effective for holding a wafer in the manufacture of semiconductor integrated circuits and having an improved cooling capacity and minimized particle generation.

The invention provides an electrostatic chuck comprising an insulating layer with an electrode embedded therein and having a surface to come in contact with a workpiece to be held. Formed on the insulating layer surface is a silicone rubber layer which is filled with reinforcing silica, but free of a filler having an average particle size of at least 0.5 μm other than the reinforcing silica.

In preferred embodiments, the reinforcing silica is fumed silica (or dry silica) having a specific surface area of at least 50 $m^2/g$ as measured by the BET method; the silicone rubber layer has a thickness of 10 to 150 μm; and the silicone rubber layer has a hardness of at least 50 and a tensile strength of at least 5 MPa.

BENEFITS OF THE INVENTION

The ESC of the invention allows for an intimate contact with a wafer and has an improved cooling capacity. It is useful for high accuracy processing because the temperature of the wafer can be maintained uniform and constant at a high accuracy in steps during the manufacture of semiconductor integrated circuits where wafers must be held in place, especially plasma etching, ion implantation, and sputtering steps. It minimizes particle generation during wafer suction clamping and allows for processing to finer feature size.

BRIEF DESCRIPTION OF THE DRAWING

The only figure.

DESCRIPTION OF THE PREFERRED EMBODIMENTS

Figure 1:
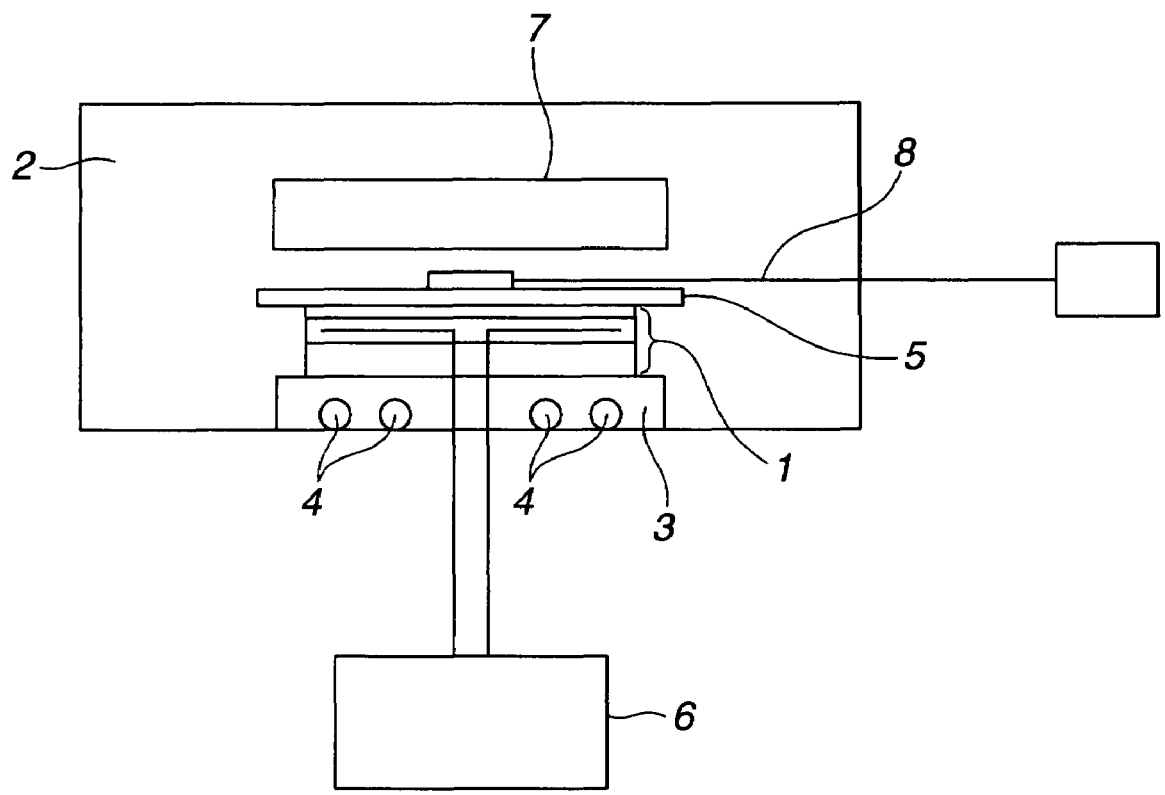
FIG. 1 is a schematic cross-sectional view of a cooling capacity testing system for evaluating the cooling capacity of an electrostatic chuck.

The present invention may be understood more readily by reference to the following detailed description of preferred embodiments of the invention and the examples included therein. As used herein, the term "hardness" is measured by the type A durometer prescribed in JIS K6249. The term "tensile strength" is measured by the method prescribed in JIS K6249. The term "workpiece" refers to a member to be held or clamped in place by the chuck, typically a wafer or substrate used in the semiconductor industry.

The ESC of the invention may be of the general type comprising an insulating layer having an electrode embedded therein. The insulating layer may be made of ceramics such as aluminum nitride, alumina, boron nitride, and silicon nitride, organic resins such as polyimides, or rubber elastomers such as silicone rubber, among which a choice may be made depending on the desired characteristics and intended application. The electrode is embedded in the insulating layer for holding a workpiece, typically a wafer by electrostatic attractive force, and may be made of metals such as copper, aluminum, nickel, silver and tungsten or conductive ceramics such as titanium nitride.

The ESC, specifically the insulating layer has a surface to come in contact with a workpiece to be held. According to the invention, a silicone rubber layer filled with reinforcing silica is formed on the insulating layer surface for the purposes of improving contact with the workpiece, enhancing a cooling capacity, suppressing particle generation by contact with the workpiece, preventing the silicone rubber layer from being transferred to the workpiece, and preventing the heat conductive filler from falling out of the layer.

The reinforcing silica-filled silicone rubber layer may be formed by curing a silicone rubber composition having reinforcing silica compounded therein.

The reinforcing silica-filled silicone rubber composition comprises as a polymer component an organopolysiloxane which has such a low level of strength, as compared with other synthetic rubbers, that it cannot be used by itself. A filler, especially reinforcing silica must be added to the organopolysiloxane before a practically acceptable level of strength can be exerted.

The organopolysiloxane used herein has the average compositional formula (1):

$$R_n SiO_{(4-n)/2} \quad (1)$$

wherein R is a substituted or unsubstituted monovalent hydrocarbon group of preferably 1 to 10 carbon atoms, more preferably 1 to 8 carbon atoms, and n is a positive number of 1.95 to 2.05. Examples of R include alkyl groups such as methyl, ethyl and propyl; cycloalkyl groups such as cyclopentyl and cyclohexyl; alkenyl groups such as vinyl and allyl; aryl groups such as phenyl and tolyl; and halogenated hydrocarbon groups in which some hydrogen atoms are substituted by halogen atoms such as chlorine and fluorine. In general, preferred are organopolysiloxanes having a backbone consisting essentially of dimethylsiloxane units, and organopolysiloxanes having vinyl, phenyl, trifluoropropyl or similar groups incorporated into the backbone. The molecular chain may be end-capped with a triorganosilyl group or hydroxyl group, while examples of the triorganosilyl group include trimethylsilyl, dimethylvinylsilyl and trivinylsilyl. The organopolysiloxane should preferably have an average degree of polymerization of at least 200 and a viscosity of at least 0.3 Pa-s at 25° C. as measured by a rotational viscometer. If the average degree of polymerization is less than 200, the organopolysiloxane as cured may have poor mechanical strength and become brittle.

Preferably, the organopolysiloxane has at least two silicon-bonded alkenyl groups in a molecule, and specifically contains 0.001 to 5 mol %, more specifically 0.01 to 1 mol % based on R of vinyl groups.

Reinforcing silica is incorporated for imparting mechanical strength to the silicone rubber. The reinforcing silica should preferably have a specific surface area of at least 50 m²/g, more preferably 100 to 400 m²/g, as measured by the BET method. Examples of the reinforcing silica include fumed silica (dry silica) and precipitated silica (wet silica), with the fumed silica (dry silica) being preferred because of less impurities. The reinforcing silica may be hydrophobized by surface treatment with organopolysiloxanes, organosilazanes, chlorosilanes or alkoxysilanes.

The amount of reinforcing silica added is generally in a range of 5 to 100 parts by weight, and preferably 20 to 80 parts by weight per 100 parts by weight of the organopolysiloxane, but not particularly limited. Less than 5 parts of silica may fail to achieve sufficient reinforcement whereas more than 100 parts of silica may adversely affect molding and working.

To the reinforcing silica-filled silicone rubber composition, fillers other than the reinforcing silica, such as carbon black and pigments may be added. As compared with the reinforcing silica, these other fillers are likely to fall out due to low affinity to the organopolysiloxane. It is thus requisite that fillers having an average particle size of at least 0.5 μm, especially at least 0.2 μm, other than the reinforcing silica be excluded. Moreover, since fillers containing more electroconductive impurities can cause wafer contamination, it is preferable to minimize the content of alkali metals, alkaline earth metals, heavy metals such as iron, nickel, copper and chromium, and compounds thereof. Specifically, the content of electroconductive impurities should preferably be equal to or less than 1 ppm, calculated as metal elements on a weight basis. It is noted that the average particle size is measured by a particle size distribution analyzer of laser diffractometry.

If necessary, there may be added various additives such as heat resistance improvers, flame retardants, and acid acceptors, fluorochemical mold release agents, and reinforcing silica-dispersing agents such as alkoxysilanes, diphenylsilanediol, carbon functional silanes and silanol-containing siloxanes.

The reinforcing silica-filled silicone rubber composition may be prepared by mixing the components uniformly on a kneading machine such as a two-roll mill, Banbury mixer, kneader or planetary mixer, and optionally heat treating the mixture at a temperature of at least 100° C.

A curing agent is used in curing the reinforcing silica-filled silicone rubber composition into a rubber elastomer or silicone rubber. The curing agent may be selected from well-known ones commonly used for the curing of ordinary silicone rubber compositions. Suitable curing agents include radical reaction curing agents, for example, organic peroxides such as di-t-butyl peroxide, 2,5-dimethyl-2,5-di(t-butylperoxy)hexane and dicumyl peroxide; addition reaction curing agents such as combinations of an organohydrogenpolysiloxane having at least two silicon-bonded hydrogen atoms in a molecule with a platinum group metal catalyst where the organopolysiloxane has alkenyl groups; and condensation reaction curing agents such as organosilicon compounds having at least two hydrolyzable groups (e.g., alkoxy, acetoxy, ketoxime or propenoxy) where the organopolysiloxane contains silanol groups. The amount of the curing agent added is as used in ordinary silicone rubber compositions.

The reinforcing silica-filled silicone rubber composition may be of the millable type or the liquid type. From the operation, molding and working aspects, reinforcing silica-filled silicone rubber compositions of the organic peroxide or addition reaction curing type are preferred.

A reinforcing silica-filled silicone rubber layer is formed on the ESC by applying a silicone rubber primer comprising a silane coupling agent, titanium coupling agent or the like to the relevant surface of ESC, uniformly coating an uncured liquid reinforcing silica-filled silicone rubber composition of the addition reaction curing type onto the surface, and heating in an oven for curing the coating. Alternatively, a layer is formed by dissolving a millable reinforcing silica-filled silicone rubber composition of the organic peroxide curing type in an organic solvent such as toluene to form a coating solution, coating the solution onto a resin film such as PET film, drying the organic solvent, laying the coated film on the ESC, and applying heat and pressure in a press molding machine or the like for curing the coating to the ESC.

The reinforcing silica-filled silicone rubber layer formed on the ESC should preferably have a thickness in the range of 10 to 150 μm, more preferably 20 to 100 μm. A layer with a thickness of less than 10 μm may provide poor contact with the wafer and a reduced cooling capacity, and fail to exert strength. A layer with a thickness of more than 150 μm may become less heat conductive, leading to a loss of cooling capacity.

The reinforcing silica-filled silicone rubber layer has a hardness which is preferably at least 50, more preferably at least 60. If the hardness is less than 50, the silicone rubber layer becomes so tacky on the surface that the rubber may be transferred to the wafer. The hardness is preferably equal to or less than 100, more preferably equal to or less than 98. The reinforcing silica-filled silicone rubber layer has a tensile strength which is preferably at least 5 MPa, more preferably at least 6 MPa. If the tensile strength is less than 5 MPa, rubber strength is so low that the rubber can be broken by repeated wafer clamping/declamping. The tensile strength is generally equal to or less than 20 MPa, especially equal to or less than 15 MPa, though the upper limit is not particularly restrictive.

EXAMPLE

Examples of the invention are given below by way of illustration and not by way of limitation.

The ESC used for testing purposes is a polyimide ESC with a diameter of 190 mm comprising a metal substrate, a polyimide film of 50 μm thick as a first insulating layer, a patterned copper foil as an electrode, and a polyimide film of 25 μm thick as a second insulating layer, laminated and joined in sequence with an epoxy adhesive.

Example 1

Using a kneader, 100 parts by weight of methylvinylpolysiloxane consisting of 99.7 mol % dimethylsiloxane units and 0.3 mol % methylvinylsiloxane units and having an average degree of polymerization of 8,000 was kneaded with 65 parts by weight of fumed silica having a BET specific surface area of 300 m$^2$/g (Aerosil® 300 by Nippon Aerosil Co., Ltd.) and 15 parts by weight of dihydroxydimethylpolysiloxane of the structural formula (2). The mixture was heat treated at 170° C. for 3 hours.

(2)

After cooling, the mixture was passed through a strainer with a 200-mesh metal screen for removing foreign matter. Using a two-roll mill, 0.7 part by weight of an organic peroxide, 2,5-dimethyl-2,5-di(t-butylperoxy)hexane was added and milled to form a reinforcing silica-filled silicone rubber composition. The filled silicone rubber composition, 100 parts by weight, was uniformly dissolved in 500 parts by weight of toluene on a homogenizer, and filtered through a 400-mesh metal screen, obtaining a coating solution. The coating solution was bar-coated onto a PET film of 100 μm thick, whereupon it was heated in an oven at 60° C. for evaporating off the toluene. In this way, an uncured reinforcing silica-filled silicone rubber sheet of 40 μm thick was formed on the PET film.

Primer C (trade name, Shin-Etsu Chemical Co., Ltd.) was applied onto the polyimide surface of the polyimide ESC and air dried. Using a vacuum press bonding machine, the uncured reinforcing silica-filled silicone rubber sheet was laid on the primed surface of ESC and heated at 160° C. for 30 minutes for curing the rubber. The PET film was stripped, and the rubber was trimmed along the edge of ESC. In an oven, the assembly was heat treated at 150° C. for 4 hours whereby a reinforcing silica-filled silicone rubber layer was formed on the surface of the polyimide ESC.

Example 2

Using a kneader, 100 parts by weight of methylvinylpolysiloxane consisting of 99.85 mol % dimethylsiloxane units and 0.15 mol % methylvinylsiloxane units and having an average degree of polymerization of 8,000 was kneaded with 50 parts by weight of fumed silica having a BET specific surface area of 200 m$^2$/g (Aerosil® 1200 by Nippon Aerosil Co., Ltd.) and 8 parts by weight of dihydroxydimethylpolysiloxane of the structural formula (2). The mixture was heat treated at 170° C. for 3 hours. Using this reinforcing silica-filled silicone rubber composition, as in Example 1, a reinforcing silica-filled silicone rubber layer of 80 μm thick was formed on the surface of the polyimide ESC.

Example 3

Using the reinforcing silica-filled silicone rubber composition in Example 1, a reinforcing silica-filled silicone rubber layer of 180 μm thick was similarly formed on the surface of the polyimide ESC.

Comparative Example 1

It is a control, that is, the polyimide ESC wherein no reinforcing silica-filled silicone rubber layer was formed on its surface.

Comparative Example 2

To the reinforcing silica-filled silicone rubber composition in Example 2, 100 parts by weight of spherical alumina having an average particle size of 0.7 μm (AO-502 by Admatechs Corp.) was added and mixed. A silicone rubber layer of 80 μm thick was similarly formed on the surface of the polyimide ESC.

[Evaluation of ESCs of Examples 1-3 and Comparative Examples 1-2]

Cooling Capacity

A cooling capacity testing system was used to evaluate the cooling capacity of the polyimide ESC (control) and the ESCs of Examples 1-3 and Comparative Example 2. FIG. 1 is a schematic cross-sectional view of the cooling capacity testing system. An ESC 1 is mounted on a pedestal 3 in a chamber 2. The pedestal 3 is provided with a cooling tube 4 through which coolant water circulates for cooling ESC 1. A 8-inch wafer 5 was rested on ESC 1, after which chamber 2 was evacuated to a vacuum of 0.01 Torr. Then, a DC voltage of ±0.5 kV from a power supply 6 was applied across ESC 1 for holding wafer 5 on ESC 1 by electrostatic attractive force.

A heater 7 was then actuated to heat wafer 5 at 150° C., after which coolant water at 4° C. was circulated through cooling tube 4. When the temperature of wafer 5 reached equilibrium, the temperature at the surface of wafer 5 was measured by a surface thermometer 8. The results are shown in Tables 1 and 2.

Wafer Backside Particles

An ESC was mounted on a power supply pedestal. A 8-inch wafer was rested on the ESC. Then, a DC voltage of ±0.5 kV from a power supply was applied across the ESC for holding the wafer in place for 1 minute by electrostatic attractive force. The DC voltage was turned off, and the wafer was detached. Using new 8-inch wafers, the electrostatic clamping procedure was repeated. After detachment, the number of particles with a size of at least 0.16 μm deposited on the backside surface of the wafer was counted by a particle counter. The results are shown in Tables 1 and 2.

TABLE 1

|  |  | Example | | |
|---|---|---|---|---|
|  |  | 1 | 2 | 3 |
| Reinforcing silica-filled silicone rubber layer | Thickness (μm) | 40 | 80 | 180 |
|  | Hardness | 80 | 62 | 80 |
|  | Tensile strength (MPa) | 8.2 | 8.8 | 8.2 |

TABLE 1-continued

|  |  | Example | | |
|---|---|---|---|---|
|  |  | 1 | 2 | 3 |
| Test results | Wafer temp. (° C.) | 63 | 66 | 74 |
| Backside particles | 1st wafer | 800 | 1200 | 700 |
|  | 10th wafer | 600 | 1000 | 500 |
|  | 20th wafer | 500 | 900 | 500 |

TABLE 2

|  |  | Comparative Example | |
|---|---|---|---|
|  |  | 1 | 2 |
| Reinforcing silica-filled silicone rubber layer | Thickness (μm) |  | 80 |
|  | Hardness |  | 75 |
|  | Tensile strength (MPa) |  | 5.8 |
| Test results | Wafer temp. (° C.) | 70 | 64 |
| Backside particles | 1st wafer | 8900 | 4200 |
|  | 10th wafer | 8800 | 3100 |
|  | 20th wafer | 9500 | 2800 |

As compared with the control polyimide ESC and comparative ESC, the ESCs within the scope of the invention had a good cooling capacity and demonstrated a drastically reduced number of particles deposited on the backside surface of wafers.

Japanese Patent Application No. 2006-124971 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An electrostatic chuck comprising:
   an electrode;
   a polyimide insulating layer with the electrode embedded therein and having a surface to come in contact with a workpiece to be held; and
   a silicone rubber layer formed on the insulating layer surface by curing a silicone rubber composition comprising 100 parts by weight of an organopolysiloxane having at least two silicon-bonded alkenyl groups in a molecule, 5 to 100 parts by weight of a filler consisting of fumed silica having a specific surface area of 100 to 400 m$^2$/g as measured by the BET method, and a curing agent in such an amount that it cures the silicone rubber composition, the silicone rubber layer being free of a filler having an average particle size of at least 0.2 μm other than the fumed silica.

2. The electrostatic chuck of claim 1, wherein said fumed silica-filled silicone rubber layer has a thickness of 10 to 150 μm.

3. The electrostatic chuck of claim 1, wherein said fumed silica-filled silicone rubber layer has a hardness of at least 50 and a tensile strength of at least 5 MPa.

4. The electrostatic chuck of claim 1, wherein the content of electroconductive impurities is equal to or less than 1 ppm, calculated as metal elements on a weight basis.

\* \* \* \* \*